(12) United States Patent
Venkatapurapu et al.

(10) Patent No.: US 11,520,957 B2
(45) Date of Patent: Dec. 6, 2022

(54) CREATING DIGITAL TWINS AT SCALE

(71) Applicant: PricewaterhouseCoopers LLP, New York, NY (US)

(72) Inventors: Sai Phanindra Venkatapurapu, Pittsburgh, PA (US); Mrinal Kanti Mandal, Austin, TX (US); Jerome Patrick Offner, Austin, TX (US); Rakesh Vidya Chandra Kapila, Bangalore (IN); Gaurav Dwivedi, Boston, MA (US); Qian Chen, New York, NY (US); Julia Hui-ling Chen, New York, NY (US); Samuel Pierce Burns, Philadelphia, PA (US); Paul M. D'Alessandro, Lake Forest, IL (US)

(73) Assignee: PricewaterhouseCoopers LLP, New York, NY (US)

( * ) Notice: Subject to any disclaimer, the term of this patent is extended or adjusted under 35 U.S.C. 154(b) by 330 days.

(21) Appl. No.: 16/874,421

(22) Filed: May 14, 2020

(65) Prior Publication Data

US 2021/0357556 A1 Nov. 18, 2021

(51) Int. Cl.
| | |
|---|---|
| *H04L 29/06* | (2006.01) |
| *G06F 30/27* | (2020.01) |
| *G06K 9/62* | (2022.01) |
| *G06N 20/00* | (2019.01) |
| *G06V 10/75* | (2022.01) |

(52) U.S. Cl.
CPC ............ *G06F 30/27* (2020.01); *G06K 9/623* (2013.01); *G06K 9/6218* (2013.01); *G06K 9/6262* (2013.01); *G06N 20/00* (2019.01); *G06V 10/751* (2022.01)

(58) Field of Classification Search
CPC ...... G06F 30/27; G06N 20/00; G06V 10/751; G06K 9/623; G06K 9/6262
See application file for complete search history.

(56) References Cited

U.S. PATENT DOCUMENTS

| | | | |
|---|---|---|---|
| 9,354,813 B1 * | 5/2016 | Dolan | G06F 3/0647 |
| 10,398,389 B1 | 9/2019 | D'alessandro et al. | |
| 2016/0247017 A1 * | 8/2016 | Sareen | G06T 7/60 |
| 2019/0188058 A1 * | 6/2019 | Martin | G06F 9/542 |

\* cited by examiner

*Primary Examiner* — Wasika Nipa
(74) *Attorney, Agent, or Firm* — Morrison & Foerster LLP (57) ABSTRACT

Described are methods and systems for calibrating simulation models to generate digital twins for physical entities. In some embodiments, a method includes receiving a plurality of datasets for a plurality of corresponding physical entities. A calibration request is enqueued to a calibration requests queue for each received dataset and includes information indicating a dataset and a corresponding physical entity. A plurality of calibration engines and a plurality of corresponding simulation clusters for generating a plurality of calibration results for a plurality of calibration requests dequeued from the calibration requests queue can be deployed. Each calibration result is enqueued to a calibration results queue as the plurality of calibration engines generates the calibration result and a plurality of calibration results dequeued from the calibration results queue in association with the plurality of corresponding physical entities can be stored as information used to generate a plurality of corresponding digital twins.

22 Claims, 5 Drawing Sheets

CREATING DIGITAL TWINS AT SCALE

FIELD OF THE DISCLOSURE

This disclosure relates generally to systems and methods for creating digital twins at scale and, in particular, for efficiently calibrating simulation models to create digital twins.

BACKGROUND OF THE DISCLOSURE

A digital twin is a dynamic virtual representation (i.e., a digital replica) of a living or non-living physical entity. For example, non-living physical entities may include objects or systems such as an organization or a physical device. For example, living physical entities may include biological processes, organs, or a person. In some embodiments, the dynamic virtual representation can include a simulation model and a set of parameters that configure the simulation model to fully describe the physical entity. In an ideal scenario, with a high-fidelity digital twin, any information that could potentially be obtained from inspecting the physical entity can be obtained from the digital twin.

Digital twins enable individuals and businesses to detect and address problems before they occur. For example, a digital twin of an automobile can enable engineers to simulate behaviors of the digital twin under test scenarios (e.g., weather conditions or software errors) to identify possible faults before they occur. In another example, a digital twin of a person can enable doctors to identify how likely that person will develop diabetes and/or when that person might develop diabetes under different exercise regimens. For all examples, detailed and complex simulation models of the physical entities are required to create digital twins that virtually represent the physical entities at high fidelity in multiple dimensions. As the complexity of each simulation model increases, however, the amount of computing resources and associated costs as well as time required to generate each digital twin grows exponentially.

SUMMARY OF THE DISCLOSURE

To address the challenges discussed above, there exists a need for systems and methods to create digital twins at scale in a resource efficient and timely manner. As a digital twin is often created by calibrating a parameter set of a digital twin model by running many model simulations, such systems and methods may also need to efficiently run the model simulations to calibrate a plurality of digital twin models for a plurality of respective physical entities. As noted above, a generated digital twin can be particularly useful to provide personalized healthcare in which a patient's genetic makeup, clinical history, lifestyle, etc. may be input to the digital twin created for the patient to determine personalized treatment regimens.

In some embodiments, a method for calibrating simulation models to generate digital twins for physical entities, comprises: receiving a plurality of datasets for a plurality of corresponding physical entities; enqueueing a calibration request to a calibration requests queue for each received dataset, the calibration request comprising information indicating a dataset and a physical entity corresponding to the dataset; deploying a plurality of calibration engines and a plurality of corresponding simulation clusters for generating a plurality of calibration results for a plurality of calibration requests dequeued from the calibration requests queue, wherein a calibration result corresponding to the calibration request comprises a set of values selected for parameters of a simulation model based on the dataset of the physical entity; enqueuing each calibration result to a calibration results queue as the plurality of calibration engines generates the calibration result; and storing a plurality of calibration results dequeued from the calibration results queue in association with the plurality of corresponding physical entities as information used to generate a plurality of corresponding digital twins.

In some embodiments, receiving the plurality of datasets comprises: receiving an input data file comprising the plurality of datasets; and parsing the input data file to identify the plurality of physical entities and the plurality of corresponding datasets.

In some embodiments, the dataset for the physical entity comprises data derived from the physical entity.

In some embodiments, the dataset for the physical entity for the physical entity comprises a calibration setting for a parameter to be calibrated for a simulation model of the physical entity, wherein the calibration setting comprises a specific range of values for the parameter.

In some embodiments, deploying the plurality of calibration engines and the plurality of corresponding simulation clusters comprises deploying a calibration engine and a corresponding simulation cluster by: allocating a plurality of computing resources on a cloud platform; and spinning up one or more containers on each allocated computing resource to deploy one or more corresponding model simulators in the simulation cluster.

In some embodiments, the method includes spinning up a plurality of containers based on a simulation application image to concurrently run a plurality of respective model simulations for the plurality of calibration requests.

In some embodiments, generating the calibration result for the calibration request dequeued from the calibration requests queue comprises: generating a plurality of simulation requests for the physical entity based on the dataset of the physical entity corresponding to the dequeued calibration request, wherein each simulation request comprises a set of values selected for the parameters of the simulation model; and enqueuing each generated simulation request from the plurality of simulation requests onto a simulation requests queue.

In some embodiments, the method includes dequeuing a simulation request from the simulation requests queue to an available model simulator in the simulation cluster to run the simulation model with the set of values included in the simulation request; running the simulation model configured according to the set of values to generate simulation outputs; and enqueueing a simulation result comprising the simulation outputs to a simulation results queue.

In some embodiments, the method includes evaluating one or more simulation results dequeued from a simulation results queue to determine whether to iteratively generate and enqueue another simulation request to the simulation requests queue to be processed by the simulation cluster.

In some embodiments, evaluating a first simulation request of the one or more simulation requests comprises: comparing simulation outputs in the first simulation request with training data from the dataset corresponding to the physical entity to compute a fitness score representing how closely the output matches the training data.

In some embodiments, generating the calibration result for the calibration request dequeued from the calibration requests queue comprises: monitoring available computing and memory resources on a cloud computing platform; when the available computing and memory resources permit, dequeuing a next calibration request from the calibration requests queue to a calibration engine and a corresponding simulation cluster deployed to process the next calibration request.

In some embodiments, enqueueing each calibration result to the calibration results queue comprises: ramping down computing resources used to generate the enqueued calibration result.

In some embodiments, ramping down the computing resources comprises: terminating a plurality of containers spun up in the simulation cluster to generate the calibration result.

In some embodiments, a system for calibrating simulation models to generate digital twins for physical entities comprises: a calibration orchestrator configured to: receive a plurality of datasets for a plurality of corresponding physical entities, and enqueue a calibration request to a calibration requests queue for each received dataset, the calibration request comprising information indicating a dataset and a physical entity corresponding to the dataset; and a calibration system configured to: deploy a plurality of calibration engines and a plurality of corresponding simulation clusters for generating a plurality of calibration results for a plurality of calibration requests dequeued from the calibration requests queue, wherein a calibration result corresponding to the calibration request comprises a set of values selected for parameters of a simulation model based on the dataset of the physical entity, and enqueue each calibration result to a calibration results queue as the plurality of calibration engines generates the calibration result; and wherein the calibration orchestrator is configured to store a plurality of calibration results dequeued from the calibration results queue in association with the plurality of corresponding physical entities as information used to generate a plurality of corresponding digital twins.

BRIEF DESCRIPTION OF THE FIGURES

The foregoing summary, as well as the following detailed description of embodiments, is better understood when read in conjunction with the appended drawings. For the purpose of illustrating the present disclosure, the drawings show example embodiments of the disclosure; the disclosure, however, is not limited to the specific methods and instrumentalities disclosed. In the drawings.

DETAILED DESCRIPTION OF THE DISCLOSURE

Some portions of the detailed description that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic, or optical signals capable of being stored, transferred, combined, compared, and otherwise manipulated. It is convenient at times, principally for reasons of common usage, to refer to these signals as bits, values, elements, symbols, characters, terms, numbers, or the like. Furthermore, it is also convenient at times to refer to certain arrangements of steps requiring physical manipulations of physical quantities as modules or code devices without loss of generality.

All of these and similar terms, however, are to be associated with the appropriate physical quantities and are merely convenient labels applied to these quantities. Unless specifically stated otherwise as apparent from the following discussion, it is appreciated that, throughout the description, discussions utilizing terms such as "processing," "computing," "calculating," "determining," "displaying," or the like refer to the action and processes of a computer system, or similar electronic computing device, that manipulates and transforms data represented as physical (electronic) quantities within the computer system memories or registers or other such information storage, transmission, or display devices.

Certain aspects of the present invention include process steps and instructions described herein in the form of an algorithm. It should be noted that the process steps and instructions of the present invention could be embodied in software, firmware, or hardware, and, when embodied in software, they could be downloaded to reside on, and be operated from, different platforms used by a variety of operating systems.

As used herein, the singular forms "a," "an," and "the" used in the following description are intended to include the plural forms as well unless the context clearly indicates otherwise.

It is to be understood that the term "and/or" as used herein refers to and encompasses any and all possible combinations of one or more of the associated listed items.

It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

The description is presented to enable one of ordinary skill in the art to make and use the invention and is provided in the context of a patent application and its requirements. Various modifications to the described embodiments will be readily apparent to those persons skilled in the art and the generic principles herein may be applied to other embodiments. Thus, the present invention is not intended to be limited to the embodiment shown but is to be accorded the widest scope consistent with the principles and features described herein.

Figure 1:
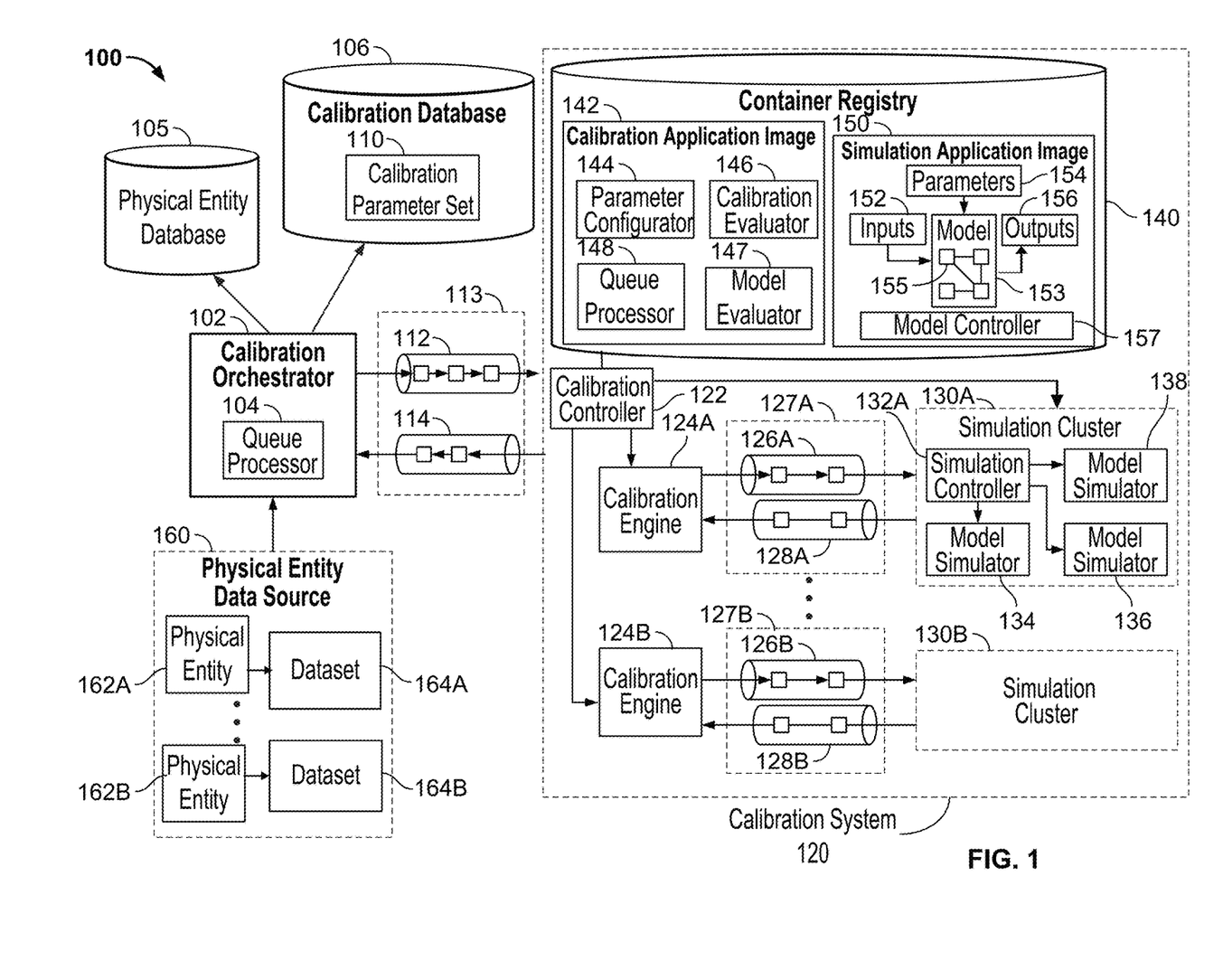
FIG. 1 illustrates a system for efficiently scaling digital twin creation for physical entities, according to some embodiments.

FIG. 1 illustrates a system 100 for efficiently scaling digital twin creation for physical entities, according to some embodiments. In some embodiments, a digital twin for a physical entity can include a simulation model 153 whose parameters 154 have been specifically calibrated to that physical entity based on a dataset generated by or for that physical entity. Therefore, creating digital twins at scale requires system 100 to efficiently calibrate simulation models. As will be further illustrated below, system 100 implements a message queue paradigm in which a plurality of message queues are deployed to store various requests and results between computing resources to improve processing speed, enable asynchronous digital twin creation, and reduce amounts of unused memory and computing resources. For example, calibration queues 113 enables calibration orchestrator 102 and calibration system 120 to communicate with each other asynchronously. In another example, simulation queues 127A-B enable corresponding calibration engines 124A-B to communicate with simulation clusters 130A-B, respectively, via an asynchronous manner.

System 100 includes a calibration orchestrator 102 configured to orchestrate operations of calibration system 120 to create digital twins for respective physical entities 162A-B based on respective datasets 164A-B received from a physical entity data source 160. In effect, calibration orchestrator 102 can serve as an interface between external entities that provide physical entity data from which digital twins are to be created, and the actual computing resources that can be used to process that physical entity data. In some embodiments, calibration orchestrator 102 can include one or more software applications deployed on a node. As will be used in the disclosure herein, a "node" can refer to a virtual machine hosted by public cloud infrastructure platforms such as Amazon Web Services (AWS), Microsoft Azure, or Google Cloud Platform (GCP).

In some embodiments, calibration orchestrator 102 can be connected via a computing network to physical entity data source 160 to receive physical entity data. For example, physical entity data source 160 may include external servers, web applications, etc. In some embodiments, physical entity data source 160 can include one or more files that are downloaded to calibration orchestrator 102. In some embodiments, physical entity data source 160 can include a data source queue for queuing physical entity datasets 164A-B as they are received from one or more external entities to physical entity data source 160.

In some embodiments, calibration orchestrator 102 can store received physical entity data in a physical entity database 105. In a medical context where physical entity data include patient's medical information such as personal health information (PHI), physical entity database 105 may be configured to store the received physical entity data as de-identified data such that the underlying patient cannot be easily obtained. In some embodiments, physical entity database 105 can include persistent memory on a local disk or cloud storage. In some embodiments, physical entity data source 160 can be a cloud storage from which calibration orchestrator 102 receives datasets 164A-B for corresponding physical entities 162A-B.

In some embodiments, datasets 164A-B for respective physical entities 162A-B can include respective sets of descriptors and observational data. In the example of system 100, physical entity data source 160 is depicted as supplying data for two physical entities 162A-B, but in practice data for hundreds or thousands of physical entities may be received. In some embodiments, portions of observational data and descriptors can be acquired by one or more sensors. As will be further described below, datasets 164A-B can be used to calibrate simulation models corresponding to physical entities 162A-B to create digital twins for physical entities 162A-B.

In some embodiments, descriptors can include data that define a condition of physical entity 162A. In some embodiments, the condition can refer to a composition, a characteristic, and/or a behavioral of physical entity 162A. For example, if physical entity 162A is a person and a digital twin is to be created to simulate a weight of that person, typical descriptors 164A may include demographic data such as gender, ethnicity, a current height, age, etc. In this example, behavioral data may include alcohol consumption, diet, and physical activity, etc.

In some embodiments, observational data can include cause and effect data that reflects how physical entity 162A reacts in response to certain stimulus. For example, if physical entity 162A is a person and a digital twin is to be created to simulate a weight of that person, observational data 166A may include a plurality of measured conditions of the person across a two year period in response to certain stimulus (e.g., a diet regime). Such measured conditions may be, for example, a weight of the person measured in daily intervals across the two year period.

In some embodiments, calibration orchestrator 102 can be configured to receive a plurality of datasets 164A-B from physical entity data source 160 in one or more data files. Before processing the one or more data files, calibration orchestrator 102 may clean and validate the data. Then, calibration orchestrator 102 may parse data records in the one or more received data files to identify different physical entities 162A-B and their corresponding datasets 164A-B. Once physical entities 162A-B have been differentiated, calibration orchestrator 102 may be configured to store datasets 164A-B in association with corresponding physical entities 162A-B in physical entity database 105.

In some embodiments, calibration orchestrator 102 can be configured to generate a calibration request for each of the identified physical entity 162A-B. In some embodiments, each calibration request includes information that identifies an individual physical entity and its physical entity dataset. For example, the calibration request may identify physical entity 162B and include a reference or link to dataset 164B stored in physical entity database 105. In some embodiments, calibration orchestrator 102 can determine calibration settings to include in the calibration request based on the identified physical entity. For example, a calibration setting may include a range of values to use to calibrate a parameter of simulation model 153 to create a digital twin for that physical entity. By including customized calibration settings specific to a physical entity in the calibration request, the digital twin created for that physical entity is likely to achieve a higher level of fidelity and requires less computing resources to create.

In some embodiments, calibration orchestrator 102 includes a queue processor 104 configured to transmit (e.g., enqueue or push) each generated calibration request to a calibration requests queue 112. As will be further described below, calibration system 120 may process calibration requests received from calibration requests queue 112 and transmit (e.g., enqueue or push) calibration results onto calibration results queue 114. In some embodiments, the use of calibration queues 113 including calibration requests queue 112 and calibration results queue 114 decouple the computations performed at calibration orchestrator 102 and calibration system 120 such that calibration system 120 may continually serve the calibration requests when the memory resources and computing resources permits calibration system 120 to do so.

In some embodiments, queue processor 104 can be configured to receive (e.g., dequeue) calibration results from calibration results queue 114 as they are generated by calibration system 120. For example, queue processor 104 may be configured to on demand or periodically pull calibration results from calibration results queue 114. In some embodiments, calibration results queue 114 can notify calibration orchestrator 102 of newly enqueued calibration results. In some embodiments, calibration orchestrator 102 can pull or dequeue a next calibration result from calibration results queue 114 when it has sufficient memory resources and computing resources.

In some embodiments, each calibration result includes information indicating an individual physical entity and indicating a set of parameter values for a simulation model to create the digital twin of that physical entity. For example, the digital twin may be created by configuring the simulation model according to the set of values to accurately model the behavior and/or characteristics of that physical entity. In some embodiments, calibration orchestrator 102 can be configured to store the received set of values for a physical entity as a calibrated parameters set 110 corresponding to physical entity 105 in calibration database 106. Like physical entity database 105, calibration database 106 can include persistent memory on a local disk or cloud storage.

In some embodiments, calibration orchestrator 102 can be configured to monitor a current computing load, a current memory load, available computing resources, available memory resources, or a combination thereof on calibration orchestrator 102 to determine whether to process a next calibration result from calibration results queue 114. In some embodiments, in response to determining that available computing and/or memory resources exceed a threshold, calibration orchestrator 102 can pull a next calibration result from calibration results queue 114.

In some embodiments, calibration system 120 can include a plurality of computing nodes provisioned on one or more cloud infrastructure platforms to process calibration requests generated by calibration orchestrator 102. Though calibration system 120 is depicted as having a handful of computing nodes (e.g., calibration controller 122, calibration engine 124A-B, and nodes in simulation clusters 130A-B, etc.), other exemplary systems can include hundreds, thousands, or hundreds of thousands of computing nodes. The number of computing nodes can be a function of the processing requirements and available computing resources of calibration system 120.

In some embodiments, to enable calibration system 120 to dynamically ramp up (also referred to as scale up) computing resources to serve additional calibration requests, calibration system 120 can include a container registry 140 and a calibration controller 122 configured to deploy calibration engines 124A-B and corresponding simulation clusters 130A-B based on container registry 140.

In some embodiments, container registry 140 can be configured to store calibration application image 142 and simulation application image 150 from which computing resources of calibration system 120 can be provisioned and deployed to calibrate simulation models for physical entities to generate respective digital twins. In some embodiments, a container image includes information that specifically provisions and configures a target machine (e.g., a virtual machine or bare metal) for execution. As is well understood by those skilled in the art, whereas a virtual machine virtualizes hardware of a physical machine, a container virtualizes an operating system to abstract the "user space." In some embodiments, an image includes one or more applications and a plurality of system libraries and dependencies that provide a standalone execution environment (i.e., an isolated operating environment) to run the one or more applications. For example, the container image may specify computing and memory resources, file dependencies, a computing environment, and include one or more applications, etc. This image may be analogous to a "snapshot" in a virtual machine environment. The container image may be immutable, however, according to some embodiments. In some embodiments, a container is an instance of a container image with a readable and writeable layer on top of the readable-only layers specified by the image. In some embodiments, the container can be an executable binary that is run by a host operating system under a set of configurations as defined by the image from which the container is instantiated.

In some embodiments, simulation application image 150 can include information to configure and instantiate a simulation application to generate model 153. In some embodiment, model 153 can be a simulation model of human physiology such as that described in U.S. Pat. No. 10,398,389, whose entire disclosure is incorporated herein by reference. In these embodiments, model 153 conceptually represents a generic human being. As described above, to create a digital twin that represents a specific individual, model 153 may need to be calibrated to generate data specific to that individual. In some embodiments, calibration can refer to estimating parameters 154 used to configure model 153 and that control how model 153 processes inputs 152 to generate outputs 156. Accordingly, a digital twin represents a simulation model 153 whose parameters 154 have values calibrated to a physical entity's data. The fidelity of the digital twin to the physical entity in the real world depends on the accuracy of the calibration.

In some embodiments, parameters 154 are numerical quantities (e.g., time-independent constants), which are used in mathematical equations that describe relationships of system variables to inputs or relationships between system variables such as system variable 155 in model 153. Therefore, parameters 154 include factors internal to model 153 and varies based on the physical entity. In some embodiments, each module and the components and connections thereof within model 153 can include one or more parameter. In some embodiments, numerical values of these parameters 154 need to be selected to configure model 153 as a digital twin of a physical entity such that outputs 156 accurately reflect how the physical entity would respond to inputs 152. Accordingly, model 153 can be uniquely defined based on a set of values assigned to parameters 154 of model 153.

In some embodiments, the simulation application can be configured to interface with a simulation message queue to process simulation requests, as will be further described below. For example, the simulation application may dequeue a simulation request that includes information specifying a set of values for parameters 154 and dataset 164A corresponding to physical entity 162A. In some embodiments, the simulation application can include a model controller 157 that is configured to run a simulation of model 153 based on received values for parameters 154 and inputs 152 in a received dataset to generate simulation outputs 156. For example, inputs 152 may include data of the physical entity 162A retrieved from physical entity database 105. For example, model controller 157 may simulate model 153 by solving a set of ordinary differential and/or algebraic equations, or the like, that defines modules and interconnections of the modules representing the physical entity. In some embodiments, the simulation output can be a set of numbers that describe changes in the values of variables comprising the model. In some embodiments, the set of numbers may be generated as a vector or a matrix. In some embodiments, model controller 157 can enqueue a simulation result including outputs 156 to a simulation results queue, as will be further explained below. By using a message queue paradigm, computing processes between the simulation application and the calibration engine can be decoupled and more efficient use of computing resources can be achieved.

In some embodiments, calibration application image 142 can include information to configure and instantiate a calibration application having one or more of the following components: a parameter configurator 144, a calibration evaluator 146, a model evaluator 147, and a queue processor 148. In some embodiments, as will be further described below, queue processor 148 can be configured to interface the calibration application with calibration orchestrator 102 and a simulation cluster (e.g., simulation cluster 130A) such that computing processes can be decoupled to allow time for specific computing resources to be allocated and deployed.

In some embodiments, the calibration application is configured to calibrate a simulation model for a single physical entity. To do so, parameter configurator 144 can be configured to generate a plurality of sets of values for calibrating parameters for a simulation model of the physical entity. In some embodiments, parameter configurator 144 can generate a simulation request for each set of values and queue processor 148 can enqueue the generated simulation request to a simulation requests queue. In some embodiments, the simulation request can include information specifying the physical entity and a set of generated model parameter values. Additionally, the simulation request may include information specifying a dataset corresponding to the physical entity that enables a simulation model to be run and evaluated. For example, the simulation request may include information that indicates where the dataset for the physical entity is stored in physical entity database 105. As described above, the simulation requests may be processed on a simulation cluster associated with the calibration application.

In some embodiments, queue processor 148 can be configured to dequeue, from the simulation results queue, simulation results generated by the simulation cluster. As described above, a simulation result may include model outputs (e.g., outputs 156) and a set of parameter values (parameters 154) used to generate the model outputs for a specific physical entity. In some embodiments, model evaluator 147 can be configured to evaluate the model outputs of the model simulation based on a training dataset for the physical entity. For example, model evaluator 147 may retrieve the training dataset from dataset 164A corresponding to physical entity 162A as stored in physical entity database 105.

Figure 3:
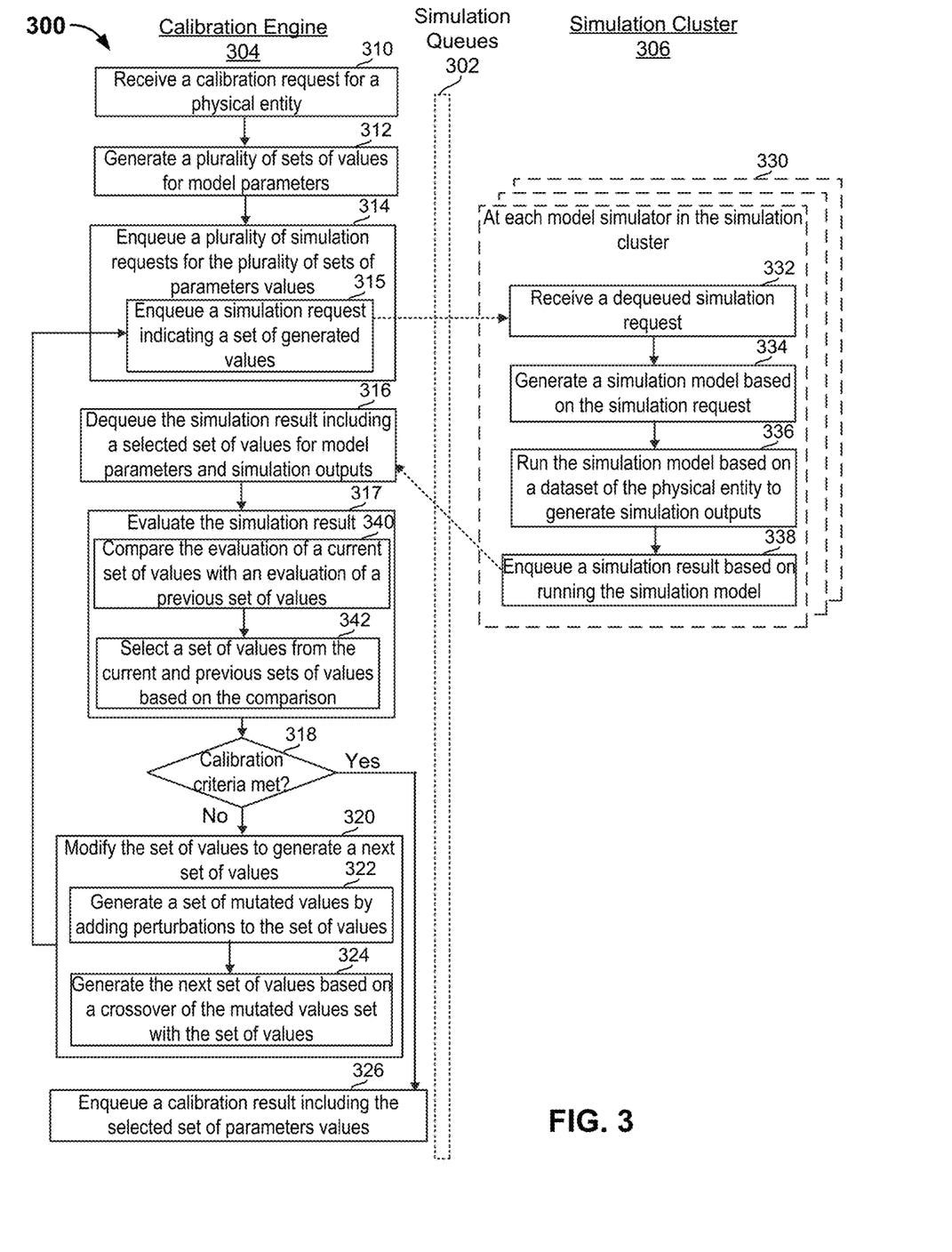
FIG. 3 illustrates a method for calibrating a simulation model for a physical entity, according to some embodiments.

In some embodiments, model evaluator 147 can compare output 156 with corresponding data in the training dataset of dataset 164A for corresponding physical entity 162A to compute a fitness score that represents how well the simulated values in outputs 156 of calibrated model 153 match the training dataset, as will be further described with respect to FIG. 3. For example, a high fitness score may indicate that model 153 calibrated with parameters 154 generates outputs 156 that more accurately matches those in the training dataset. In other words, an instance of model 153 whose system variables 155 are calibrated according to parameters 154 would accurately simulate how the physical entity would react to the same set of inputs 152.

In some embodiments, calibration evaluator 146 can be configured to determine whether to continue to iteratively calibrate parameters of the model based on one or more received simulation requests. In some embodiments, calibration evaluator 146 can be configured to determine whether to continue to iteratively calibrate parameters of the model based on one or more fitness scores for corresponding sets of parameters values, a number of iterations, an amount of time spent calibrating the model, or a combination thereof. As discussed above, model evaluator 147 may be configured to compute a fitness score for each set of selected parameter values and corresponding outs in a simulation result dequeued from the simulation results queue (e.g., simulation results queue 128A).

In some embodiments, calibration evaluator 146 can be configured to determine whether the fitness score for the set of parameters values is acceptable by comparing the fitness score to a predetermined threshold value. For example, if the fitness score is determined to be below the threshold value, parameter configurator 144 can be configured to generate a next set of parameters values for the model. In some embodiments, the threshold value can be predetermined based on a type of the model, the physical entity, or a desired level of accuracy needed for the intended use of the created digital twin.

In some embodiments, calibration evaluator 146 can be configured to track a number of performed iterations to determine whether to continue to iteratively calibrate parameters of the model. For example, calibration evaluator 146 may determine to stop calibrating the simulation model if the number of tracked iterations meets or exceeds a predetermined threshold amount (e.g., 200 times, etc.).

In some embodiments, in a next iteration of calibrating the model parameters, parameter configurator 144 can be configured to generate a different set of parameters values based on the previous set of parameters values. In some embodiments, parameter configurator 144 can implement one or more calibration algorithms to generate a next set of parameters values. In some embodiments, parameter configurator 144 can implement a population-based evolutionary algorithm (EA) such as a differential evolution (DE) algorithm to generate the next set of parameters values, as will be further described below with respect to FIG. 3. In some embodiments, parameter configurator 144 can be configured to implement a plurality of calibration algorithms to generate a plurality of corresponding sets of parameters values.

In some embodiments, upon determining to stop iteratively calibrating the simulation model, calibration evaluator 146 can determine that a set of parameters values corresponding to the best fitness score calibrates the model for the physical entity as a digital twin of that physical entity. Then, queue processor 148 may enqueue a calibration result to a calibration results queue where the calibration result includes the determined set of parameters values and information identifying the associated physical entity.

In some embodiments, calibration evaluator 146 can be configured to track multiple sets of parameter values corresponding to the best fitness scores across the iterations of calibration. For example, calibration evaluator 146 may save a predetermined number of sets of parameter values having the highest fitness scores (e.g., in the instances that a higher fitness score means higher accuracy). In another example, calibration evaluator 146 may save a subset of the predetermined number of sets of parameter values having fitness scores above a predetermined threshold score. In these embodiments, queue processor 148 may enqueue a calibration result having a plurality of sets of parameter values for a single physical entity. Subsequently, calibration orchestrator 102 receiving this calibration result may store a plurality of calibration parameter sets 110 for a corresponding physical entity 105 in calibration database 106. This approach may be useful in contexts where models are highly sensitive to inputs or parameter values such as in a medical context.

In some embodiments, calibration controller 122 can be configured to allocate computing resources to scale up and deploy a plurality of calibration engines 124A-B and corresponding simulation clusters 130A-B to serve calibration requests queued in calibration requests queue 112. In some embodiments, calibration controller 122 can deploy each of calibration engines 124A-B based on calibration application image 142 stored in container registry 140. In other words, a calibration engine may represent an instantiation of calibration application image 142, according to some embodiments.

In some embodiments, calibration controller 122 can monitor available computing resources and/or memory resources in calibration system 120 to determine whether a next calibration request can be processed. If so, calibration controller 122 may, for example, create and deploy calibration engine 124A and a corresponding simulation cluster 130A. Additionally, calibration controller 122 may configure a simulation queues 127A that serves as a communication interface between calibration engine 124A and simulation cluster 130A. In some embodiments, calibration controller 122 can deploy a set of computing and memory resources including a calibration engine, simulation queues, and a simulation cluster to serve each calibration request.

In some embodiments, calibration requests queue 112 can notify calibration controller 122 of calibration requests as they are enqueued by calibration orchestrator 102. Once the set of computing and memory resources has been deployed by calibration controller 122, calibration controller 122 can dequeued a next calibration request from calibration requests queue 112 to a newly deployed calibration engine to generate a calibration result. In some embodiments, once the calibration result has been generated and enqueued to calibration results queue 114, calibration controller 122 can be configured to release and ramp down the computing resources deployed to generate the calibration result. For example, calibration controller 122 may terminate calibration engine 124B and corresponding simulation cluster 130B previously spun up to generate the calibration result. In some embodiments, terminating these calibration engines can save computing resources and reduce costs associated with generating digital twins.

In some embodiments, simulation cluster 130A deployed by calibration controller 122 can include a simulation controller 132A and a plurality of model simulators 134-138 deployed on a plurality of computing nodes. In some embodiments, simulation controller 132A can be configured to allocate computing resources within simulation cluster 130A to scale up and deploy model simulators 134-138 based on simulation application image 150 stored in container registry 140. In other words, a model simulator can be implemented as a container that represents an instantiation of simulation application image 150. For example, the model simulator may be configured based on the Docker container format.

In some embodiments, simulation controller 132A can serve as a container manager configured to schedule containers in simulation cluster 130A and manage them automatically based on defined requirements such as CPU and memory. In some embodiments, simulation cluster 130A can be configured on on-premises, hybrid, or public cloud infrastructure. In some embodiments, as part of computing resource management, calibration controller 122 can move model simulators to underutilized nodes or schedule new nodes to be added to support deployment of additional model simulators.

In some embodiments, simulation controller 132A can be configured to monitor a current computing load, a current memory load, available computing resources, available memory resources, or a combination thereof in simulation cluster 130A to determine whether to process a next simulation request from simulation requests queue 126A. In some embodiments, simulation requests queue 126A can be configured to notify simulation controller 132A of simulation requests as they are enqueued by calibration engine 124A. In some embodiments, in response to determining that available computing and/or memory resources exceed a threshold, simulation controller 132A can dequeue a next simulations request from simulation requests queue 126A to an available model simulator, e.g., model simulator 134.

As described above with respect to simulation application image 150, a model simulator (e.g., any of model simulators 134-138) receives a set of parameters values for the model of a physical entity from a dequeued simulations request. In some embodiments, the model simulator can be configured to retrieve a dataset corresponding to the physical entity to obtain inputs for running a simulation of model. Based on the received set of parameters values and retrieved dataset, a model controller (e.g., model controller 157) of the model simulator can run the model simulation to generate simulation outputs. In some embodiments, the model controller can be configured to generate a simulation result that includes the simulation outputs and the set of parameters values used to generate the simulation outputs. Then, the model controller may enqueue the generated simulation result to simulation results queue 128A. Upon completing its processing, the model simulator may notify simulation controller 132A that it has finished generating and enqueuing the simulation result.

As described above, a calibration engine (e.g., calibration engine 124A) can dequeue the simulation result from simulation results queue 128A. Then, a model evaluator (e.g., model evaluator 147) of the calibration engine can evaluate an accuracy of the model calibrated according to using the set of parameters values by comparing the simulation outputs to a training dataset included in the received dataset. For example, the model evaluator may calculate a fitness score that represents the evaluation result. If the calibration engine determines that the evaluation result meets a predefined criteria, then the calibration engine may generate a calibration result that includes the evaluation result and the set of parameters values used to calibrate the model that produced the evaluation result (e.g., the fitness score).

Figure 2:
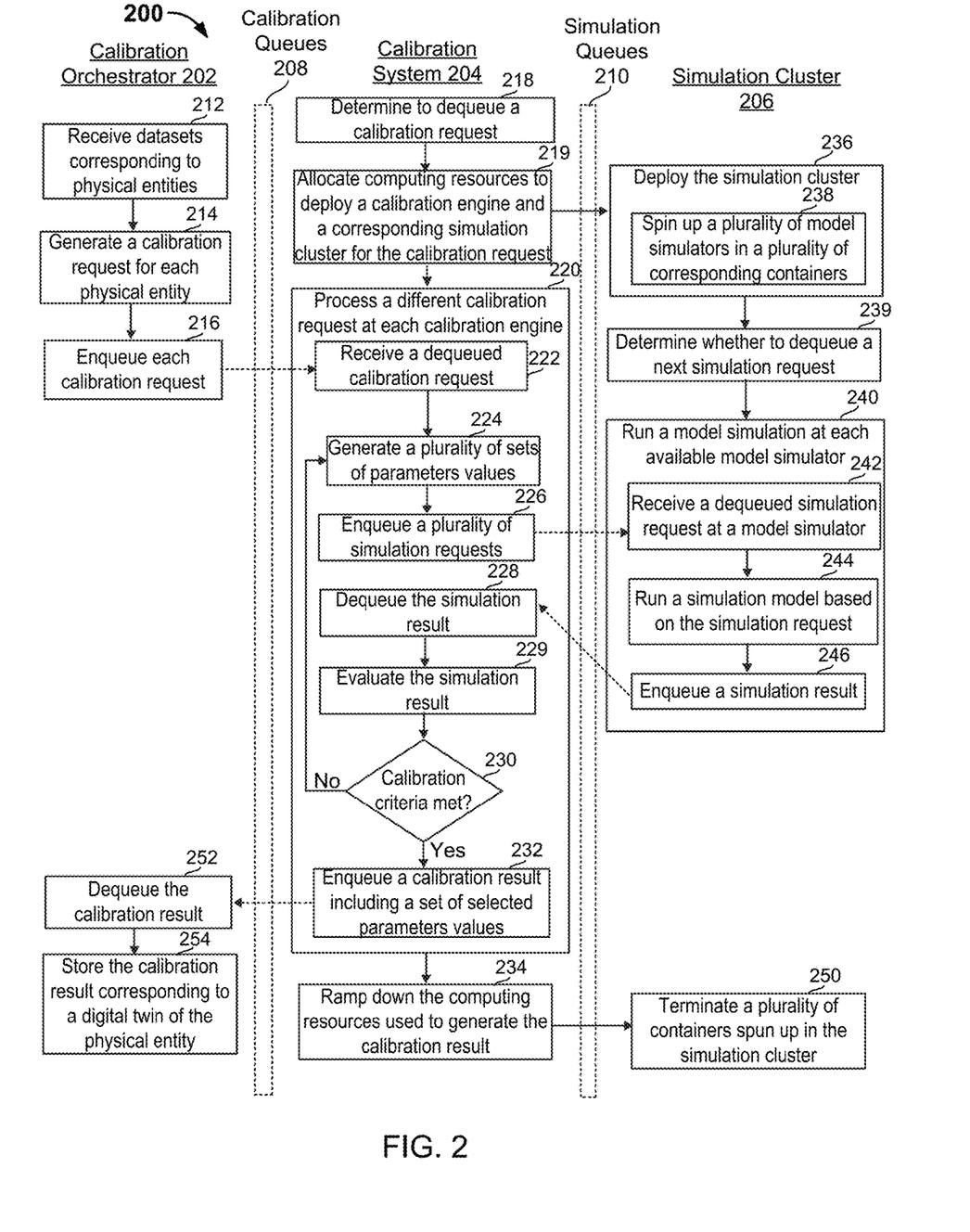
FIG. 2 illustrates a method for creating digital twins for physical entities, according to some embodiments.

FIG. 2 illustrates a method 200 for creating digital twins for physical entities, according to some embodiments. In some embodiments, method 200 can be performed by the following components: a calibration orchestrator 202 (e.g., calibration orchestrator 102), a calibration system 204 (e.g., calibration system 120), and a simulation cluster 206 (e.g., simulation cluster 130A). In some embodiments, one or more method steps may be performed by a different component or performed jointly by multiple components, as will be further described below. As discussed above, a digital twin can be created for a person (i.e., an example physical entity) to provide more accurate and personalized healthcare using the illustrated method 200. For ease of explanation, method 200 may be described with respect to the similarly named components of FIG. 1.

Also shown in FIG. 2 are calibration queues 208 (e.g., calibration queues 113) and simulation queues 210 (e.g., simulation queues 127A), which represent mechanisms through which the components communicate with each other, as will be further described below. In some embodiments, calibration queues 208 may include a calibration requests queue and a calibration results queue. In some embodiments, simulation queues 210 may include a simulation requests queue and a simulation results queue. The dotted lines shown in FIG. 2 represent interactions with one of the queues, as will be detailed below.

In step 212, calibration orchestrator 202 receives a plurality of datasets for a plurality of corresponding physical entities. In some embodiments, calibration orchestrator 202 can receive the plurality of datasets in one or more data files from physical entity data source 160 of FIG. 1. For example, calibration orchestrator 202 may receive a notification from physical entity data source indicating that one or more datasets for corresponding physical entities have been added. In some embodiments, calibration orchestrator 202 can parse the one or more data files received from physical entity data source to identify a plurality of entities 162A-B corresponding to a plurality of respective datasets 164A-B. In other embodiments, calibration orchestrator 202 may receive the plurality of datasets uploaded by a user.

In step 214, calibration orchestrator 202 generates a calibration request for each identified physical entity. In some embodiments, the calibration request includes information specifying a physical entity and a dataset corresponding to the physical entity. In some embodiments, calibration orchestrator 202 may generate one or more calibration settings for one or more corresponding parameters to include in the calibration request. As described above with respect to FIG. 1, a parameter can be a numerical quantity that is used to configure a simulation model and thereby affects the behavior and/or output of the simulation model. In some embodiments, a dataset received for a physical entity can include one or more calibration settings for one or more corresponding parameters.

In some embodiments, a calibration setting can be a range of values for a specific parameter of the simulation model to be calibrated. In some embodiments, an initial estimate of the range can be obtained from scientific literature, or other suitable source, in various ways. For example, previously published models of similar systems may suggest likely ranges of parameters, or the like. Accordingly, data observed in experimental studies related to a given process can be examined and initial ranges can be estimated by calibration orchestrator 202 based on the results of such studies. In some embodiments, the ranges can be empirically determined by iterative trials, a random guess, or a default value.

In step 216, calibration orchestrator 202 enqueues each calibration request to calibration queues 208 such as calibration requests queue 112.

In some embodiments, calibration orchestrator 202 can perform steps 212-216 continuously as additional datasets for additional physical entities are received. In some embodiments, calibration orchestrator 202 can monitor a current computing load, a current memory load, available computing resources, available memory resources, or a combination thereof to determine whether to retrieve one or more additional datasets for one or more additional corresponding physical entities.

In step 218, calibration system 204 determines to dequeue a calibration request from calibration queues 208 such as calibration requests queue 112. In some embodiments, calibration system 204 can be allotted a preconfigured amount of computing resources and memory resources. Calibration system 204 may monitor its available computing resources and memory resources to determine whether it can process an additional calibration request. For example, if the available computing resources exceeds a threshold value, calibration system 204 may dequeue the next calibration request. In some embodiments, calibration system 204 can receive a notification from calibration queues 208 indicating that a next calibration request has been enqueued to calibration requests queue 112 by calibration orchestrator 202.

In step 219, calibration system 204 allocates computing resources to deploy a calibration engine (e.g., calibration engine 124A) and a corresponding simulation cluster (e.g., simulation cluster 130A) for the calibration request of step 218. For example, calibration controller 122 may allocate the computing resources. In some embodiments, by utilizing calibration queues 208 as a communications interface to cache communications between calibration orchestrator 202 and calibration system 204, calibration system 204 can be configured to independently ramp up or scale its operations without stalling the computing processes of calibration orchestrator 202.

In step 220, calibration system 204 processes a different calibration request at each calibration engine deployed by calibration controller 122. In some embodiments, step 220 shows steps 222-232 performed at each deployed calibration engine.

In step 222, the calibration engine (e.g., calibration engine 124A) receives a dequeued calibration request from calibration queues 208 (e.g., a calibration requests queue). In some embodiments, the calibration requests includes information specifying a physical entity (physical entity 162A) and a corresponding dataset (e.g., dataset 164A). In some embodiments, a calibration request for a physical entity may also include one or more calibration settings for that physical entity.

In step 224, the calibration engine generates a plurality of sets of parameters values based on the calibration request to calibrate the simulation model for the physical entity. In some embodiments, a parameter configurator (e.g., parameter configurator 144) of the calibration engine generates the plurality of sets of parameters values.

In step 226, the calibration engine enqueues a plurality of simulation requests corresponding to the generated plurality of sets of parameters values to simulation queues 210 (e.g., simulation requests queue 126A).

In step 236, simulation cluster 206 is deployed based on the computing resources allocated by calibration system 204 in step 219. In some embodiments, step 236 includes step 238, at which simulation cluster 206 spins up a plurality of model simulators (e.g., model simulators 134-138) on a plurality of corresponding containers. As described with respect to FIG. 1, a simulation controller (e.g., simulation controller 132A) of simulation cluster 206 can deploy a model simulator by instantiating a simulation application image 150 on a container running on a computing node in simulation cluster 206.

In step 239, simulation cluster 206 determines whether to dequeue a next simulation request from simulation queues 210. In some embodiments, a simulation controller (e.g., simulation controller 132A) of simulation cluster 206 can monitor available computing resources and a status of computing resources of simulation cluster 206 to determine whether a next simulation request can be processed. For example, when a new model simulator is spun up in step 238, the simulator controller may determine that the next simulation request can be processed. In another example, when a previously spun up model simulator finishes execution and becomes idle, the simulator controller may determine that the previously spun up model simulator have available bandwidth to process the next simulation request.

In step 240, simulation cluster 206 runs a model simulation at each available model simulator. In some embodiments, a simulation controller (e.g., simulation controller 132A) of simulation cluster 206 may coordinate when the model simulation is to be run and which model simulator is to run the model simulation. In some embodiments, step 240 shows steps 242-246 performed at each spun up model simulator. In step 242, the model simulator receives a dequeued simulation request. As described with respect to FIG. 1, the simulation request can include a set of generated parameters values for a physical entity.

In step 244, the model simulator (e.g., model controller 157) runs a simulation model based on the simulation request. In some embodiments, to run the simulation model, the model simulator can generate a version of the simulation model based on the set of generated parameters values indicated in the received simulation request of step 242. For example, the simulation model may have default values for a plurality of parameters used to configure system variables of the simulation model. After parsing the set of parameters values from the received simulation request, the model simulator may replace the default values with the parsed set of parameters values, which results in a different version of the simulation model. As discussed above with respect to FIG. 1, the objective of the calibration process is to select a set of parameters values that can calibrate the simulation model to accurately mimic the behavior or characteristics of the physical entity being modeled. A well-calibrated simulation model can serve as a digital twin of the physical entity.

In some embodiments, the model simulator can be configured to retrieve a dataset corresponding to the physical entity indicated in the simulation request to run the simulation model configured according to the set of generated parameters values. In some embodiments, the model simulator can query or retrieve the dataset from physical entity database 105 or physical entity data source 160. In some embodiments, the model simulator can select a portion of the dataset as inputs to run the simulation model to obtain simulation outputs (e.g., outputs 156).

In step 246, the model simulator enqueues a simulation result to a simulation results queue of simulation queues 210. In some embodiments, the simulation result includes outputs that are computed by running the simulation model configured according to the received set of parameters values, as described above with respect to step 244. In some embodiments, the simulation result also includes information specifying the set of parameters values used to generate the outputs of the simulation model used to model a particular physical entity.

In step 228, the calibration engine dequeues the simulation result from the simulation results queue of simulation queues 210. As noted above, the simulation result for a physical entity can include a set of parameters values and outputs generated from the simulation model configured according to the set of parameters values. In some embodiments, the calibration engine can perform step 228 continuously as simulation results are enqueued by model simulators in simulation cluster 206 to simulation queues 210. For example, the calibration engine may monitor its available computing and memory resources to determine whether a next simulation result can be dequeued and processed. If so, the calibration engine may dequeue the next simulation result. In another example, simulation queues 210 may notify the calibration engine of simulation results as they are enqueued to the simulation results queue.

In step 229, the calibration engine evaluates the simulation result. In some embodiments, a model evaluator (e.g., model evaluator 147) of the calibration engine can be configured to compare the simulation result (e.g., outputs of running the simulation model) with training data associated with the physical entity to determine how accurately the set of parameters values calibrate the simulation model to represent a digital twin of the physical entity. For example, as described above in FIG. 1, the model evaluator can calculate an evaluation result including a fitness score that represents how closely the simulation outputs match corresponding values in the training data. In some embodiments, the model evaluator can retrieve the training data of the physical entity by querying for the dataset of the physical entity stored in a physical entity database (e.g., physical entity database 105).

In step 230, the calibration engine determines whether a calibration criteria is met based on the evaluation result (e.g., a fitness score) determined in step 229. In some embodiments, a calibration evaluator of the calibration engine (e.g., calibration evaluator 146) can evaluate a fitness score in the evaluation result, determine a number of calibration iterations that have been performed, determine an amount of elapsed time to calibrate the model for the physical entity, or a combination thereof as described in FIG. 1, to determine whether the calibration criteria has been met. In some embodiments, the calibration criteria can be based on multiple simulation results. In these embodiments, the calibration engine may wait until a plurality of simulation results for a plurality of corresponding sets of parameters values have been received in step 228 before determining whether the calibration criteria has been met.

In some embodiments, if the calibration criteria has not been met, method 200 proceeds to step 224, in which the parameter configurator of the calibration engine generates a next plurality of sets of parameters values. For example, the parameter configurator may implement a differential evolution algorithm to modify a previous set of parameters values to generate a next set of parameters values. Further examples are described below with respect to FIG. 3.

In contrast, if the calibration criteria has been met, method 200 proceeds to step 232. In step 232, the calibration engine enqueues a calibration result including a set of selected parameters values to a calibration results queue of calibration queues 208. In some embodiments, the set of selected parameters values represent values that best calibrates the simulation model for an associated physical entity. In some embodiments, the calibration result can include the fitness score generated in step 229 and used to determine whether a calibration criteria has been met in step 230. As described above with respect to FIG. 1, the calibration result can include multiple sets of parameter values corresponding to the best fitness scores across the iterations of calibration according to some embodiments. In these embodiments, the calibration result can include a plurality of sets of parameter values for a single physical entity and/or a plurality of fitness scores for the plurality of corresponding sets of parameter values.

In step 234, the calibration controller in calibration system 204 ramps down the computing resources used to generate the calibration result for the physical entity. In some embodiments, after enqueueing the calibration result, the calibration engine can notify the calibration controller that it has finished processing the calibration request of step 222. In some embodiments, ramping down the computing resources include terminating the calibration engine and its correspondingly spun up simulation cluster. As shown in FIG. 2, in step 250, simulation cluster 206 terminates a plurality of containers spun up in simulation cluster 206.

Additionally, simulation cluster 206 may be terminated to release the allocated computing resources. Accordingly, computing resources in calibration system 204 can be dynamically downscaled based on computing needs to reduce cost and wasted computing capacity.

In step 252, calibration orchestrator 202 dequeues the calibration result from the calibration results queue of calibration queues 208. As described above in FIG. 1, calibration queues 208 may notify calibration orchestrator 202 of calibration results as they are enqueued to the calibration results queue.

In step 254, calibration orchestrator 202 stores the calibration result corresponding to a digital twin of the physical entity in a calibration database. In some embodiments, the calibration results includes a set of values that best calibrate the parameters of a simulation model to replicate the physical entity. In some embodiments, a digital twin of the physical entity can be obtained by retrieving the stored calibration result and configuring the simulation model according to the set of parameters values specified in the calibration result.

FIG. 3 illustrates a method 300 for calibrating a simulation model for a physical entity, according to some embodiments. In some embodiments, method 300 shows the interactions between a calibration engine in calibration system 204 and simulation cluster 206 from FIG. 2 in greater detail. As shown in FIG. 3, method 300 can be performed by calibration engine 304, which may be deployed by calibration system 204, and simulation cluster 306. Additionally, simulation queues 302 may correspond to simulation queues 210 of FIG. 2 and can include a simulation requests queue (e.g., simulation requests queue 126A) and a simulation results queue (e.g., simulation results queue 128A) to enable calibration engine 304 and simulation cluster 306 to communicate with each other asynchronously.

In step 310, calibration engine 304 receives a calibration request for a physical entity. As described with respect to FIGS. 1-2, the calibration request may be dequeued from a calibration requests queue 112 of calibration queues 113 or calibration queues 208. In some embodiments, the calibration request includes information that indicates the physical entity and a dataset corresponding to and derived for or from the physical entity. The dataset may include input data specific to the physical entity and training data specific to the physical entity and used to evaluate an accuracy of a generated simulation model.

In step 312, calibration engine 304 generates a plurality of sets of values for model parameters of a simulation model. For example, calibration engine 304 may initially generate 200 sets of parameters values. In some embodiments, a set of calibrated values for the model parameters used to configure the simulation model represents a digital twin that acts as a digital replica of the physical entity.

In some embodiments, each set of parameters values includes a random combination of values. For example, to generate a value for a parameter, calibration engine 304 may randomly sample a range of values for the parameter. In some embodiments, the range of values for the parameter can be set in a calibration setting for that parameter and received in the calibration request.

In step 314, calibration engine 304 enqueues a plurality of simulation requests for the plurality of sets of parameters values. For example, in step 315, calibration engine 304 enqueues a simulation request indicating a set of values generated for the model parameters. As shown in FIG. 3, the simulation request can be enqueued to simulation queues 302 such as simulation requests queue 126A. In some embodiments, calibration engine 304 enqueues a simulation request for each set of values. Accordingly, calibration engine 304 generates a quantity of simulation requests that corresponds to the plurality of sets of values in step 312. In some embodiments, the simulation request comprises a current vector including the plurality of values selected for the model parameters.

As shown in FIG. 3, blocks 330 represent method steps 332-338 performed at each model simulator spun up in simulation cluster 306. As described with respect to FIG. 2, simulation cluster 306 may be deployed for calibration engine 304 to concurrently run a plurality of model simulations on a plurality of respective containers. Simulation cluster 306 may include a plurality of computing nodes in a cloud computing platform where each node may instantiate one or more containers that each runs a simulation application for a single simulation model. In some embodiments, simulation cluster 306 may individually dequeue simulation requests from simulation queues 302 based on an available computing resource and memory resource of one or more containers. For example, simulation cluster 306 may forward a dequeued simulation request to an idle model simulator or request that the idle model simulator retrieve the dequeued simulation request.

In step 332, a model simulator receives a dequeued simulation request. In step 334, the model simulator generates a model simulation based on the simulation request. In some embodiments, generating the simulation model includes configuring the parameters of the simulation model with the current vector of parameters values received in the simulation request. For example, the model simulator may overwrite the previous model parameter values with the set of received parameters values in the current vector.

In step 336, the model simulator runs the simulation model based on a dataset of the physical entity to generate simulation outputs. In some embodiments, the model simulator inputs portions of the dataset to the simulation model and runs the simulation model with the updated parameters in the current vector to generate the simulation outputs.

In step 338, the model simulator enqueues a simulation result based on running the simulation model. In some embodiments, the simulation result includes the set of parameters values received in step 332 and the simulation outputs generated in step 336.

In step 316, calibration engine 304 dequeues the simulation result including the selected set of values for the model parameters and the simulation outputs.

In step 317, calibration engine 304 evaluates the simulation result dequeued in step 316. In some embodiments, to evaluate the simulation result, a model evaluator (e.g., model evaluator 147) of the calibration engine can compare the simulation outputs in the simulation result with training data from a dataset of the physical entity to determine how well the current vector of parameters values calibrate the simulation model. For example, as part of evaluating the simulation result, the model evaluator may calculate a fitness score presenting a goodness of fit between the simulation outputs and the training data. In some embodiments, the model evaluator can store the fitness score in association with the current vector.

In some embodiments, step 317 includes steps 340 and 342 related to how calibration engine 304 further evaluates the simulation result.

In step 340, the model evaluator compares the evaluation of a current set of values in the current vector with an evaluation of a previous set of values in a previous vector.

For example, the model evaluator may compare the fitness score of the current vector with a fitness score generated by the previous vector.

In step 342, the model evaluator selects a set of values from the current and previous sets of values based on the comparison of step 340. In some embodiments, if the current vector has a better fitness score (e.g., a lower score), the model evaluator replaces the previous vector with the values in the current vector. Otherwise, the model evaluator keeps the values in the previous vector to be evaluated in a next iteration. Accordingly, the evaluation result generated by the model evaluator can include a selected set of values for model parameters that results in the better fitness score.

In step 318, calibration engine 304 determines whether calibration criteria is met based on the evaluation result generated in step 317. Example calibration criteria were described above with respect to step 230 of FIG. 2. If the calibration criteria is not met, then method 300 proceeds to step 320. Otherwise, method 300 proceeds to step 326.

In step 326, calibration engine 304 enqueues a calibration result including the selected set of parameters values of step 316. In some embodiments, the calibration result also includes the fitness score associated with the selected set of parameters values. As described with respect to FIGS. 1 and 2, the selected set of parameters values correspond to a calibrated parameter set for the physical entity indicated in the calibration request in step 310.

In step 320, calibration engine 304 modifies the set of values to generate a next set of values. In some embodiments, calibration engine 304 implements one or more optimization algorithms to modify the set of values. In some embodiments, the one or more optimization algorithms include a modified differential evolution (DE) algorithm that implements a p-best crossover strategy (MDE-pBX), as will be further described below. In some embodiments, step 320 includes steps 322 and 324, which corresponds to performing the MDE algorithm and the pBX strategy, respectively. Other algorithms for modifying the set of values may be employed in addition to or instead of the MDE-pBX algorithm.

In step 322, calibration engine 304 generates a set of mutated values by adding perturbations to the set of values received in step 316. In some embodiments, calibration engine 304 computes the perturbations for the set of values based on a selected mutation strategy as part of differential evolution. For example, calibration engine 304 may be configured to implement one or more mutation strategies. Upon computing the perturbations, calibration engine 304 may add the perturbations to the set of values to generate a mutated vector of values.

In step 324, calibration engine 304 generates the next set of values based on a crossover of the mutated values set with the set of values. In some embodiments, calibration engine 304 can randomly select a plurality of indices within the current vector of parameters values. For each selected index, calibration engine 304 can replace the parameter value in the current vector with the corresponding mutated value in the mutated vector of values. Then, method 300 proceeds back to step 315 and calibration engine 304 enqueues a next simulation request indicating the set of updated values for the parameters. Accordingly, the set of values for the model parameters can be iteratively updated to improve how accurately the simulation model represents the physical entity as defined by the dataset corresponding to the physical entity.

Figure 4:
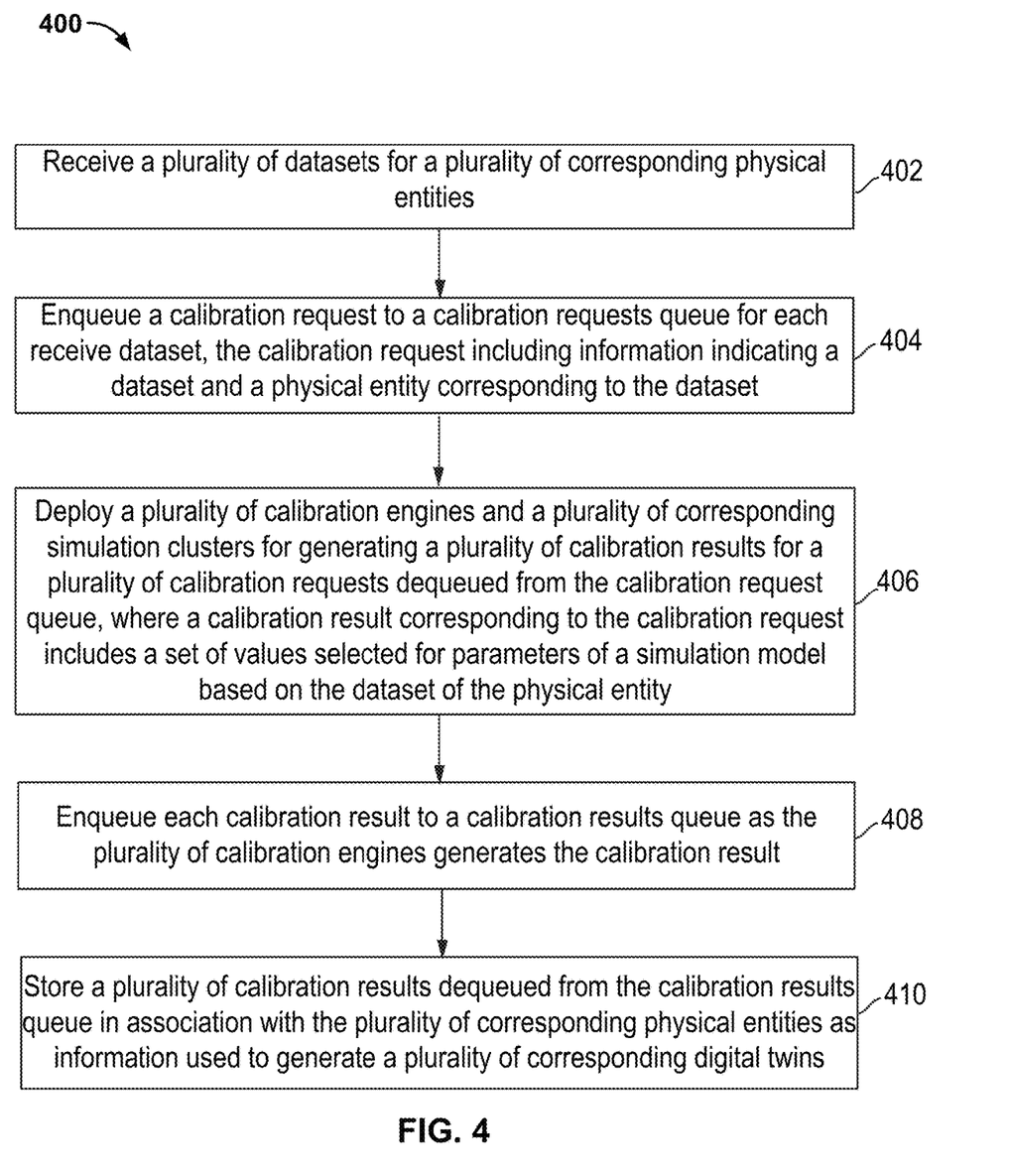
FIG. 4 illustrates a method for calibrating simulation models to generate digital twins for a plurality of physical entities, according to some embodiments.

FIG. 4 illustrates a method 400 for calibrating simulation models to generate digital twins for a plurality of physical entities, according to some embodiments. In some embodiments, method 400 can be performed by system 100 as discussed above with respect to FIG. 1. One or more steps of method 400 may correspond to one or more steps of methods 200 and 300 of FIGS. 2-3, as will be further described below.

In step 402, a calibration orchestrator (e.g., calibration orchestrator 102) of the system receives a plurality of datasets for a plurality of corresponding physical entities. In some embodiments, a dataset for a physical entity includes descriptive data defining a composition or characteristics of the physical entity. In some embodiments, the descriptive data includes a set of descriptors that correspond to inputs of the simulation model. In some embodiments, the dataset includes behavioral data that describe how the physical entity reacts to certain stimulus. In some embodiments, the behavioral data corresponds to a training dataset used to calibrate the simulation model.

In step 404, the calibration orchestrator enqueues a calibration request to a calibration requests queue for each received dataset, and the calibration request includes information indicating a dataset and a physical entity corresponding to the dataset. For example, the calibration request for the physical entity may include information (e.g., a memory address, a data identifier, or a link) that specifies where the dataset of the physical entity is stored on the memory storage. In some embodiments, the calibration request includes the dataset for the physical entity. In some embodiments, the calibration orchestrator can generate a calibration request for each physical entity of the plurality of physical entities.

In some embodiments, for each physical entity, the calibration orchestrator can be configured to generate calibration settings specific to the physical entity based on features of that physical entity. For example, the calibration orchestrator may determine ranges for parameter values based on descriptors or behavior data of the physical entity, as described above with respect to FIG. 1. By including personalized calibration settings in the calibration request for the physical entity, the calibration engine may be more likely to determine a set of parameters values that most accurately calibrates a simulation model as a digital twin of that physical entity.

In step 406, a calibration controller of a calibration system (e.g., calibration system 120) deploys a plurality of calibration engines and a plurality of corresponding simulation clusters for generating a plurality of calibration results for a plurality of calibration requests dequeued from the calibration requests queue, where a calibration result corresponding to the calibration request includes a set of values selected for parameters of a simulation model based on the dataset of the physical entity. In some embodiments, the plurality of calibration engines and simulation clusters are deployed on a cloud computing platform. In some embodiments, the calibration system deploys a set of calibration engine and simulation cluster for each dequeued calibration request. In some embodiments, step 406 corresponds to steps 220-234 of method 200, as described above with respect to FIG. 2. In some embodiments, step 406 corresponds to method 300, as described above with respect to FIG. 3.

In some embodiments, the calibration requests queue can be hosted on one or more computing resources of a cloud platform. As described above, by holding the calibration requests on the calibration requests queue, the calibration system can be enabled to scale more efficiently as it allocates computing resources to deploy a calibration engine and a corresponding simulation cluster without losing any of the calibration requests.

In some embodiments, the calibration controller (e.g., calibration controller 122) monitors available computing and memory resources on the cloud computing platform. For example, a predetermined amount of computing and/or memory resources may be allotted to the calibration system. When the calibration controller determines that available computing and memory resources exists, the calibration controller can dequeue a next calibration request from the calibration requests queue and spin up a next calibration engine and a corresponding simulation cluster to serve the dequeued calibration request.

In step 408, each calibration result is enqueued to a calibration results queue as the plurality of calibration engines generates the calibration result. In some embodiments, when a calibration engine determines that a calibration criteria has been met, as described above in FIGS. 2-3, the calibration engine can be configured to enqueue its calibration result to the calibration results queue.

In step 410, the calibration orchestrator stores a plurality of calibration results dequeued from the calibration results queue in association with the plurality of corresponding physical entities as information used to generate a plurality of corresponding digital twins. In some embodiments, step 410 corresponds to step 254, as described above with respect to FIG. 2.

Figure 5:
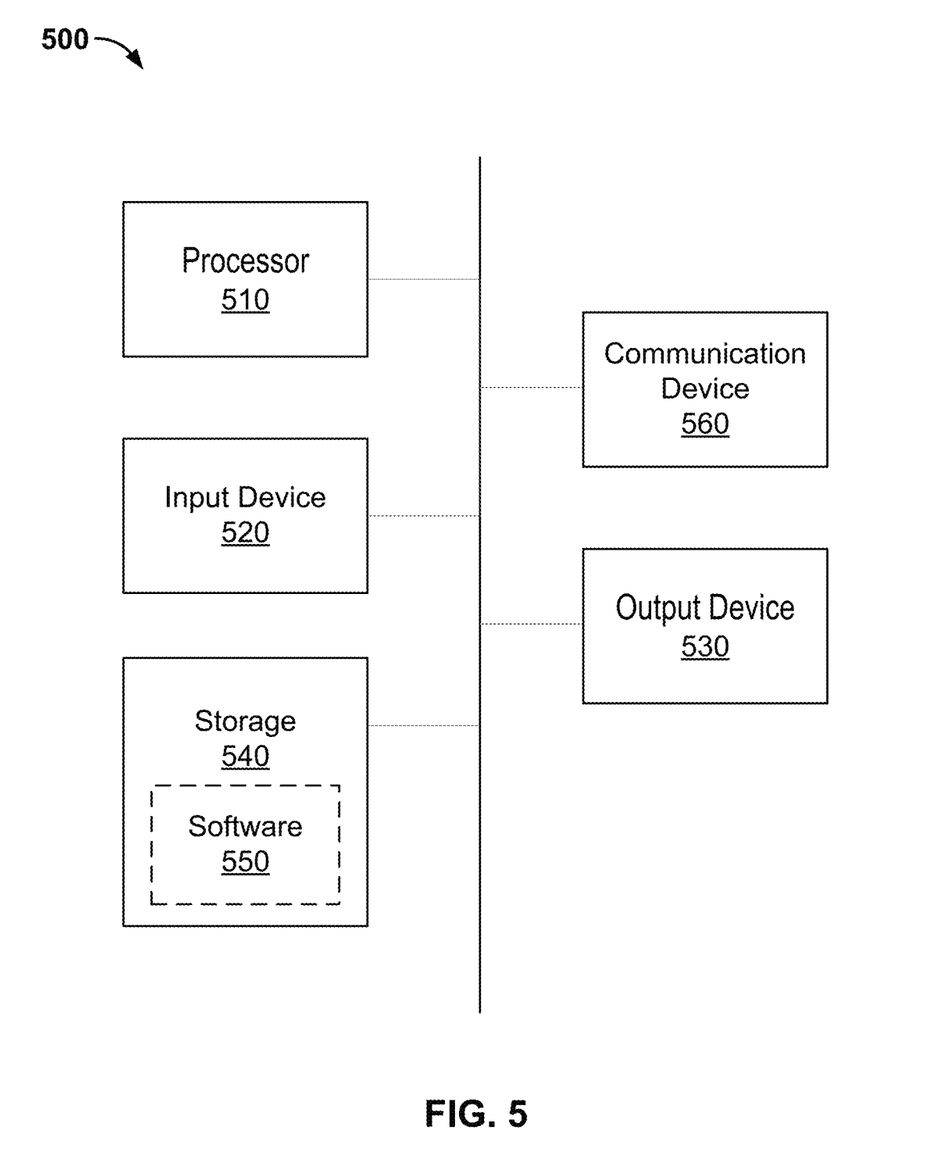
FIG. 5 illustrates an example of a computing device, according to some embodiments.

FIG. 5 illustrates an example of a computing device in accordance with one embodiment. Device 500 can be a host computer connected to a network. Device 500 can be a client computer or a server. As shown in FIG. 5, device 500 can be any suitable type of microprocessor-based device, such as a personal computer, work station, server, or handheld computing device (portable electronic device) such as a phone or tablet. The device can include, for example, one or more of processor 510, input device 520, output device 530, storage 540, and communication device 560. Input device 520 and output device 530 can generally correspond to those described above and can either be connectable or integrated with the computer.

Input device 520 can be any suitable device that provides input, such as a touchscreen, keyboard or keypad, mouse, or voice-recognition device. Output device 530 can be any suitable device that provides output, such as a touchscreen, haptics device, or speaker.

Storage 540 can be any suitable device that provides storage, such as an electrical, magnetic, or optical memory including a RAM, cache, hard drive, or removable storage disk. Communication device 560 can include any suitable device capable of transmitting and receiving signals over a network, such as a network interface chip or device. The components of the computer can be connected in any suitable manner, such as via a physical bus, or wirelessly.

Software 550, which can be stored in storage 540 and executed by processor 510, can include, for example, the programming that embodies the functionality of the present disclosure (e.g., as embodied in the devices described above).

Software 550 can also be stored and/or transported within any non-transitory, computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 540, that can contain or store programming for use by or in connection with an instruction-execution system, apparatus, or device.

Software 550 can also be propagated within any transport medium for use by or in connection with an instruction-execution system, apparatus, or device, such as those described above, that can fetch instructions associated with the software from the instruction-execution system, apparatus, or device and execute the instructions. In the context of this disclosure, a transport medium can be any medium that can communicate, propagate, or transport programming for use by or in connection with an instruction-execution system, apparatus, or device. The transport readable medium can include, but is not limited to, an electronic, magnetic, optical, electromagnetic, or infrared wired or wireless propagation medium.

Device 500 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 500 can implement any operating system suitable for operating on the network. Software 550 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for purpose of explanation, has made reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments, with various modifications, that are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

What is claimed is:

1. A method for calibrating simulation models to generate digital twins for physical entities, comprising:
  receiving a plurality of datasets for a plurality of corresponding physical entities;
  enqueueing a calibration request to a calibration requests queue for each received dataset, the calibration request comprising information indicating a dataset and a physical entity corresponding to the dataset;
  deploying a plurality of calibration engines and a plurality of corresponding simulation clusters for generating a plurality of calibration results for a plurality of calibration requests dequeued from the calibration requests queue, wherein a calibration result corresponding to the calibration request comprises a set of values selected for parameters of a simulation model based on the dataset of the physical entity, wherein generating the calibration result for the calibration request dequeued from the calibration requests queue comprises:

generating a plurality of simulation requests for the physical entity based on the dataset of the physical entity corresponding to the dequeued calibration request, wherein each simulation request comprises a set of values selected for the parameters of the simulation model; and enqueuing each generated simulation request from the plurality of simulation requests onto a simulation requests queue;

enqueuing each calibration result to a calibration results queue as the plurality of calibration engines generates the calibration result;

storing a plurality of calibration results dequeued from the calibration results queue in association with the plurality of corresponding physical entities as information used to generate a plurality of corresponding digital twins;

dequeuing a simulation request from the simulation requests queue to an available model simulator in the simulation cluster to run the simulation model with the set of values included in the simulation request;

running the simulation model configured according to the set of values to generate simulation outputs; and enqueueing a simulation result comprising the simulation outputs to a simulation results queue.

2. The method of claim 1, wherein receiving the plurality of datasets comprises:

receiving an input data file comprising the plurality of datasets; and parsing the input data file to identify the plurality of physical entities and the plurality of corresponding datasets.

3. The method of claim 1, wherein the dataset for the physical entity comprises data derived from the physical entity.

4. The method of claim 1, wherein the dataset for the physical entity comprises a calibration setting for a parameter to be calibrated for a simulation model of the physical entity, wherein the calibration setting comprises a specific range of values for the parameter.

5. The method of claim 1, wherein deploying the plurality of calibration engines and the plurality of corresponding simulation clusters comprises deploying a calibration engine and a corresponding simulation cluster by:

allocating a plurality of computing resources on a cloud platform; and spinning up one or more containers on each allocated computing resource to deploy one or more corresponding model simulators in the simulation cluster.

6. The method of claim 5, comprising:

spinning up a plurality of containers based on a simulation application image to concurrently run a plurality of respective model simulations for the plurality of calibration requests.

7. The method of claim 1, comprising:

evaluating one or more simulation results dequeued from a simulation results queue to determine whether to iteratively generate and enqueue another simulation request to the simulation requests queue to be processed by the simulation cluster.

8. The method of claim 7, wherein evaluating a first simulation request of the one or more simulation requests comprises:

comparing simulation outputs in the first simulation request with training data from the dataset corresponding to the physical entity to compute a fitness score representing how closely the output matches the training data.

9. The method of claim 1, wherein generating the calibration result for the calibration request dequeued from the calibration requests queue comprises:

monitoring available computing and memory resources on a cloud computing platform;

when the available computing and memory resources permit, dequeuing a next calibration request from the calibration requests queue to a calibration engine and a corresponding simulation cluster deployed to process the next calibration request.

10. The method of claim 1, wherein enqueueing each calibration result to the calibration results queue comprises:

ramping down computing resources used to generate the enqueued calibration result.

11. The method of claim 10, wherein ramping down the computing resources comprises:

terminating a plurality of containers spun up in the simulation cluster to generate the calibration result.

12. A system comprising a memory and hardware processor for calibrating simulation models to generate digital twins for physical entities, comprising:

a calibration orchestrator configured to:

receive a plurality of datasets for a plurality of corresponding physical entities, and enqueue a calibration request to a calibration requests queue for each received dataset, the calibration request comprising information indicating a dataset and a physical entity corresponding to the dataset; and a calibration system configured to:

deploy a plurality of calibration engines and a plurality of corresponding simulation clusters for generating a plurality of calibration results for a plurality of calibration requests dequeued from the calibration requests queue, wherein a calibration result corresponding to the calibration request comprises a set of values selected for parameters of a simulation model based on the dataset of the physical entity, wherein generating the calibration result for the calibration request dequeued from the calibration requests queue comprises:

generating a plurality of simulation requests for the physical entity based on the dataset of the physical entity corresponding to the dequeued calibration request, wherein each simulation request comprises a set of values selected for the parameters of the simulation model; and enqueuing each generated simulation request from the plurality of simulation requests onto a simulation requests queue; and enqueue each calibration result to a calibration results queue as the plurality of calibration engines generates the calibration result;

wherein the calibration orchestrator is configured to:

store a plurality of calibration results dequeued from the calibration results queue in association with the plurality of corresponding physical entities as information used to generate a plurality of corresponding digital twins;

dequeue a simulation request from the simulation requests queue to an available model simulator in the simulation cluster to run the simulation model with the set of values included in the simulation request;

run the simulation model configured according to the set of values to generate simulation outputs; and enqueue a simulation result comprising the simulation outputs to a simulation results queue.

13. The system of claim 12, wherein to receive the plurality of datasets, the calibration orchestrator is configured to:

receive an input data file comprising the plurality of datasets; and parse the input data file to identify the plurality of physical entities and the plurality of corresponding datasets.

14. The system of claim 12, wherein the dataset for the physical entity comprises data derived from the physical entity.

15. The system of claim 12, wherein the dataset for the physical entity comprises a calibration setting for a parameter to be calibrated for a simulation model of the physical entity, wherein the calibration setting comprises a specific range of values for the parameter.

16. The system of claim 12, wherein to deploy the plurality of calibration engines and the plurality of corresponding simulation clusters, the calibration orchestrator is configured to deploy a calibration engine and a corresponding simulation cluster by:

allocating a plurality of computing resources on a cloud platform; and spinning up one or more containers on each allocated computing resource to deploy one or more corresponding model simulators in the simulation cluster.

17. The system of claim 16, wherein the calibration orchestrator is configured to:

spin up a plurality of containers based on a simulation application image to concurrently run a plurality of respective model simulations for the plurality of calibration requests.

18. The system of claim 12, wherein the calibration orchestrator is configured to:

evaluate one or more simulation results dequeued from a simulation results queue to determine whether to iteratively generate and enqueue another simulation request to the simulation requests queue to be processed by the simulation cluster.

19. The system of claim 18, wherein to evaluate a first simulation request of the one or more simulation requests, the calibration orchestrator is configured to:

compare simulation outputs in the first simulation request with training data from the dataset corresponding to the physical entity to compute a fitness score representing how closely the output matches the training data.

20. The system of claim 12, wherein to generate the calibration result for the calibration request dequeued from the calibration requests queue, the calibration orchestrator is configured to:

monitor available computing and memory resources on a cloud computing platform;

when the available computing and memory resources permit, dequeue a next calibration request from the calibration requests queue to a calibration engine and a corresponding simulation cluster deployed to process the next calibration request.

21. The system of claim 12, wherein to enqueue each calibration result to the calibration results queue, the calibration orchestrator is configured to:

ramp down computing resources used to generate the enqueued calibration result.

22. The system of claim 21, wherein ramping down the computing resources comprises:

terminating a plurality of containers spun up in the simulation cluster to generate the calibration result.

* * * * *